United States Patent [19]

Mori et al.

[11] Patent Number: 4,935,799
[45] Date of Patent: Jun. 19, 1990

[54] COMPOSITE SEMICONDUCTOR DEVICE

[76] Inventors: Mutsuhiro Mori, 19-4-203, Ishinazakacho-1-chome; Tomoyuki Tanaka, 5-5, Omikacho-6-chome; Yasumichi Yasuda, 10-3, Onumacho-1-chome, all of Hitachi, Japan

[21] Appl. No.: 285,328

[22] Filed: Dec. 13, 1988

Related U.S. Application Data

[63] Continuation of Ser. No. 73,094, Jul. 14, 1987, abandoned.

[30] Foreign Application Priority Data

Jul. 14, 1986 [JP] Japan .................. 61-163833

[51] Int. Cl.[5] .............................. H01L 27/02
[52] U.S. Cl. ....................... 357/43; 357/42; 357/23.1; 357/23.14; 357/23.4; 357/46
[58] Field of Search ............... 357/42, 43, 23.1, 23.4, 357/23.14, 46

[56] References Cited

U.S. PATENT DOCUMENTS

| | | | |
|---|---|---|---|
| 4,063,273 | 12/1977 | Müeller | 357/43 |
| 4,150,392 | 4/1979 | Nonaka | 357/43 |
| 4,567,502 | 1/1986 | Nakagawa et al. | 357/23.4 |
| 4,622,573 | 11/1986 | Bakeman, Jr. et al. | 357/86 |
| 4,630,084 | 12/1986 | Tihanyi | 357/23.4 |
| 4,698,655 | 10/1987 | Schultz | 357/23.4 |
| 4,729,007 | 3/1988 | Coe | 357/86 |

Primary Examiner—Martin H. Edlow
Attorney, Agent, or Firm—Antonelli, Terry and Wands

[57] ABSTRACT

Disclosed is a composite semiconductor device which comprises: a second and a third semiconductor regions of a second conductivity type formed in a first semiconductor region of a first conductivity type independently of each other and so as to be exposed on one main surface of a semiconductor substrate; a fourth and a fifth semiconductor regions of the first conductivity type formed in the second semiconductor region independently of each other and so as to be exposed on the one main surface of the semiconductor substrate; a first insulated gate electrode formed on the second semiconductor region located between the fifth and first semiconductor regions and exposed on the one main surface; a second insulated gate electrode formed on the first semiconductor region located between the second and third semiconductor regions and exposed on the one main surface; an electrode which shorts the fourth and third semiconductor regions; another electrode which shorts the second and fifth semiconductor regions; and a further electrode provided in the first semiconductor region.

5 Claims, 3 Drawing Sheets

COMPOSITE SEMICONDUCTOR DEVICE

This application is a continuation of application Ser. No. 073,094, filed on July 14, 1987, now abandoned.

BACKGROUND OF THE INVENTION

The present invention relates to a composite semiconductor device provided with a complementary insulated gate field effect transistor (C.MOSFET) and a bipolar transistor at input and output sides respectively, and particularly relates to such a composite semiconductor device having a structure suitable to make the production easy and to make the performance high.

FIG. 1 shows a conventional composite semiconductor device 2 in which a C.MOSFET and a bipolar transistor are formed on one and the same semiconductor substrate, as disclosed in Japanese Patent Unexamined Publication No. 57-183067.

In the composite semiconductor device 2, an n⁻ layer 12 is formed by crystal growth on an n⁺ layer 11, a p layer 21 is formed in the n⁻ layer 12, n layers 31 and 32 are formed in each p layer 21 isolated from each other, and p layers 41 are further formed in the n layer 31.

As is apparent, in one unit of the device, an n-type channel MOSFET Tr4 is formed of the n⁻ layer 12, p layer 21 and n layer 32 and a p-type channel MOSFET Tr3 is formed of the p layer 21, the n layer 31 and the p layer 41. Respective MOS gate electrodes 54 and 56 of the MOSFET Tr4 and the MOSFET Tr3 are shorted to form a C. MOSFET.

The n layer 31 and the p layer 41 are shorted through an emitter electrode 52, and a collector electrode 51 is in low ohmic contact with the n⁺ layer 11. The n layer 32 and the p layer 21 are shorted through an electrode 53.

An equivalent circuit of the composite semiconductor device 2 of FIG. 1 is shown in FIG. 2.

Thus, as illustrated in FIG. 1, a current of electrons ⊖ flowing in the MOSFET Tr4 upon application of a positive potential to a gate G is converted into a current of holes ⊕ which is effective as a base current ⊕ of an npn transistor Tr1 formed of the n layer 31, p layer 21 and n layer 12. By the base current, electrons ⊖ are injected from the n layer 31 into the n⁻ layer 12 to thereby turn on the composite semiconductor device 2.

On the other hand, if negative potential is applied to the gate G, the MOSFET Tr4 is turned off and the base current is cut off so that the injection of electrons ⊖ from the n layer 31 is stopped. At the same time, the MOSFET Tr3 is turned on so that excess carriers stored in the p layer 21 and the n⁻ layer 12 can be rapidly collected to the emitter electrode 52 through the MOSFET Tr3. Accordingly, the composite semiconductor device 2 can be turned off at a high speed.

Such a composite semiconductor device has features in that the power consumption at the gate is low because of the use of a MOS gate, while it has a capacity of higher power than a mere MOSFET because of the use of a bipolar transistor Tr1, and further high speed switching can be performed.

In such a conventional composite semiconductor device as described above, however, it is essential to provide a pnpn four-layer structure constituted by the n⁻ layer 12, p layer 21, n layer 31 and p layer 41.

In forming these layers by diffusion from the emitter electrode E side, it is necessary to make the carrier concentration higher in an upper layer than a lower layer in order to assure a higher current-amplification factor of the transistor Tr1 resulting in that it is very physically difficult to make the uppermost p layer 41 having high concentration. There is a further problem that if the concentration of the n layer 31 is made higher, the threshold voltage of the MOSFET Tr3 becomes extremely higher.

Other than the method by diffusion, there is a method in which the layers are formed by crystal growth. The method by crystal growth has a problem that the process in production is extremely complicated.

Further, the composite semiconductor device 2 of FIG. 1 has another problem in that the current of the device when the device is turned on is determined by the base current flowing into the npn transistor Tr1, and therefore the current of the composite semiconductor device 2 is restricted by an on-resistance R (FIG. 1) of the MOSFET Tr4 so that it is difficult to provide an electric power capacity as high as that in a unit bipolar transistor.

Furthermore, as apparent from FIG. 1, the composite semiconductor device has a vertically formed pnpn thyristor structure and therefore there is a possibility of latch-up (turn-on) of the device. Thus, inconveniently, the gate becomes uncontrollable if the device is once latched up.

SUMMARY OF THE INVENTION

It is therefore an object of the present invention to provide a composite semiconductor device composed of a bipolar transistor and a C.MOSFET, which can be produced easily, having no vertically formed thyristor structure, and provide a large power capacity.

According to the present invention, a composite semiconductor device is provided to comprise a first semiconductor region of a first conductivity type, second and third semiconductor regions of a second conductivity type formed in said first semiconductor region isolatedly from each other so as to expose at one main surface of said semiconductor device fourth and fifth semiconductor regions of the first conductivity type formed in said second semiconductor region isolatedly from each other so as to expose at said one main surface, a first insulated gate electrode formed on a portion of said second semiconductor region interposed between said fifth and first semiconductor regions and exposed at said one main surface, a second insulated gate electrode formed on a portion of said first semiconductor region interposed between said second and third semiconductor regions and exposed at said one main surface, first electrode means providing a short circuit between said fourth and third semiconductor regions, second electrode means providing a short circuit between said second and fifth semiconductor regions, and third electrode means connected to said first semiconductor region.

In the composite semiconductor device according to the present invention, the uppermost p layer 41 required in the prior art of FIG. 1 can be omitted so that the device is formed of no pnpn four-layer structure but a three-layer structure. As the result, the device can be simplified in structure as well as in manufacturing process and improved in reliability.

Further, the device provides a higher current capacity because the on-resistance R can be reduced and the base current can be increased owing to the excess carriers (holes ⊕) generated in the n⁻ layer 12.

BRIEF DESCRIPTION OF THE DRAWINGS

Other objects, features and advantages of the present invention will be apparent more fully from the following description taking in conjunction with the accompanying drawings, wherein.

DESCRIPTION OF THE PREFERRED EMBODIMENTS

Figure 3:
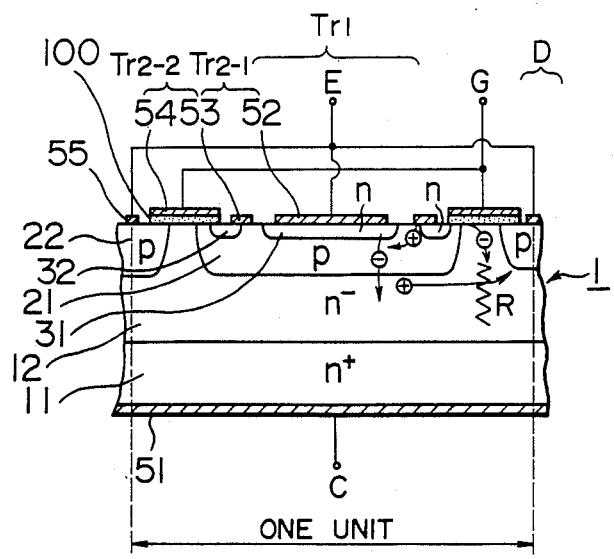
FIG. 3 is a cross section of an embodiment of the composite semiconductor device according to present invention.
Figure 4:
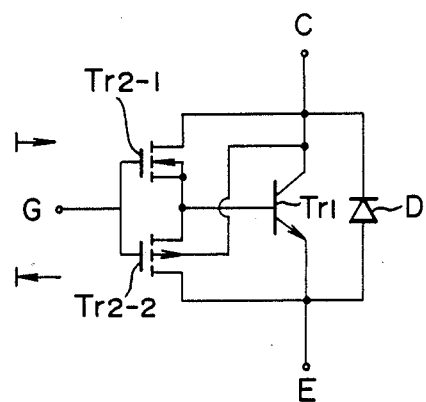
FIG. 4 is an equivalent circuit of the composite semiconductor device shown in FIG. 3.

Referring to FIGS. 3 and 4, a first embodiment of the invention will be described hereunder. FIG. 3 is a cross section of the embodiment of the composite semiconductor device according to present invention, and FIG. 4 is an equivalent circuit of the composite semiconductor device shown in FIG. 3.

In a composite semiconductor device 1 of this embodiment, an $n^-$ layer 12 is formed on a substrate made of an $n^+$ layer 11 of a silicon semiconductor, and p layers 21 and 22 are formed in the $n^-$ layer 12 isolatedly from each other. Further, an n layer 31 and n layers 32 are formed in the layer 21 independently of each other. The signs "+" and "−" added to the symbols "p" and "n" representing the type of conductivity represent higher and lower concentration, respectively, of impurities of the associated conductivity type.

As seen from FIG. 3, in one unit of the device, the $n^-$ layer 12, p layer 21 and n layer 32 form source, channel and drain regions, respectively, of an n-type channel MOSFET Tr2-1, and the p layer 21, $n^-$ layer 12 and p layer 22 form source, channel and drain regions, respectively, of a p-type channel MOSFET Tr2-2.

A pair of MOSFET's Tr2-1 and Tr2-2 commonly have a MOS gate electrode 54 provided through a gate insulating layer ($SiO_2$) 100. The p layer 21 and the n layer 32 are shorted through an electrode 53. Actually, a plurality of such units are formed continuously on the same $n^+$ substrate 11.

The MOS gate electrode 54 electrically connected to a gate terminal G and the gate insulating layer 100 of $SiO_2$ disposed under the MOS gate electrode 54 are formed so as to extend over the n layer 32, p layer 21, $n^-$ layer 12 and p layer 22. The p layer 22 is shorted with the n layer 31 through electrodes 55 and 52 formed on the upper surfaces of the p layer 22 and the n layer 31 respectively. The electrodes 55 and 52 are commonly electrically connected to an emitter terminal E. Further, a collector electrode 51 is in low ohmic contact with the $n^+$ layer 11 and electrically connected to a collector electrode C.

When a positive voltage is applied to the gate G of the composite semiconductor device 1, an n-channel layer is formed in the p layer 21 under the MOS gate electrode 54 and the n-type channel MOSFET Tr2-1 constituted of the $n^-$ layer 12, p layer 21 and n layer 32 is turned on. The current of electrons $\ominus$ is converted by the electrode 53 into a base current of holes $\oplus$ so that electrons $\ominus$ are injected into the p layer 21 of a transistor Tr1 and the composite semiconductor device 1 is turned on.

On the contrary, if a negative voltage is applied to the gate terminal G, the n-channel of the p layer 21 is cut off so that the electron injection from the MOSFET Tr2-1 to the p layer 21 is inhibited. At the same time, the p-type channel MOSFET Tr2-2 is turned on so that the p layer 21 is shorted with the emitter terminal E through the MOSFET Tr2-2 and the electrode 55.

As a result, excess carriers stored in the p layer 21 and $n^-$ layer 12 are rapidly collected to the emitter terminal E to thereby turn off rapidly the composite semiconductor device 1.

Figure 1:
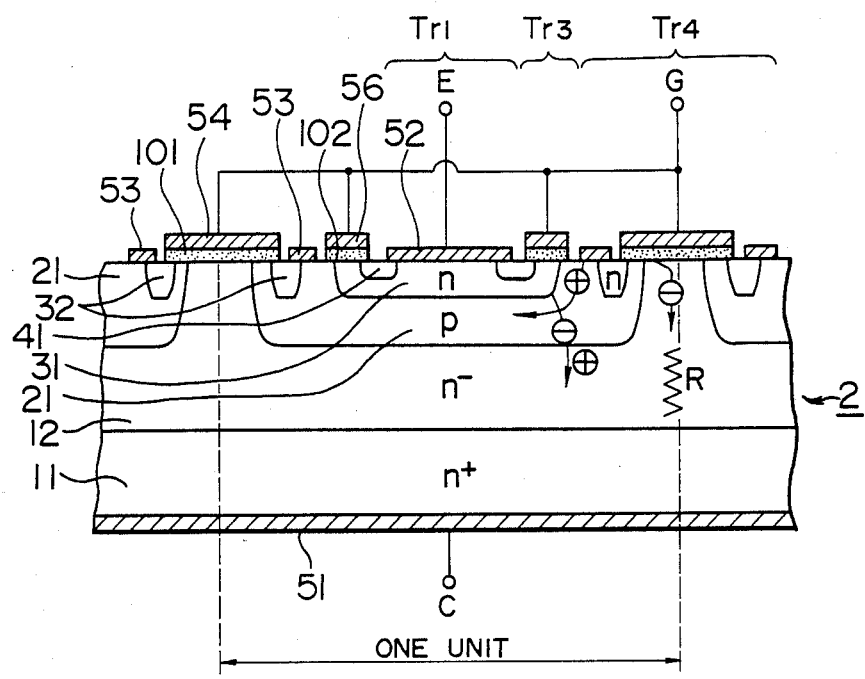
FIG. 1 is a cross section of a conventional composite semiconductor device.
Figure 2:
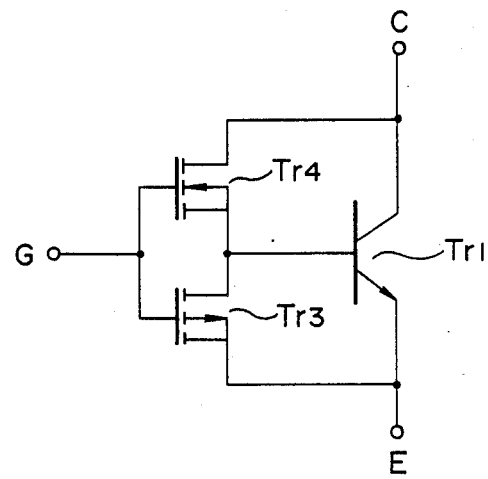
FIG. 2 is an equivalent circuit of the composite semiconductor device shown in FIG. 1.

As described above, the composite semiconductor device 1 according to the present invention can perform the same operation as that of the conventional composite semiconductor device illustrated in FIG. 1 and additionally has the following advantages which are generally not obtained by the conventional composite semiconductor device of FIG. 1.

(1) The composite semiconductor device 1 has a vertical npn 3-layer structure composed of the n-layers 11, 12; p-layers 21, 22; and n-layers 31, 32. Accordingly, the composite semiconductor device 1 can be made by a simple process similarly to the conventional bipolar transistors or power MOSFET and additionally, since the MOS gate is commonly used for turning-on and turning-off the composite semiconductor device 1, it is not necessary to provide two of such MOS gates unlike the conventional device. Accordingly, the manufacturing process can be made extremely simple.

(2) Since excess carriers ($\oplus$) produced in the p layer 21 and the $n^-$ layer 12 upon injection of the electrons $\ominus$ from the n layer 31 into the p layer 21 at the on-state can be led into the electrode 52 and the emitter E through the electrode 55, the resistance R which would otherwise restrict the base current of the npn transistor Tr1 can be lowered by the holes $\oplus$. Thus, the current of the MOSFET Tr2-1 can be made larger, resulting in a larger current capacity of the npn transistor Tr1. When the injected electrons $\ominus$ increases, the resistance R is further reduced, which in turn increases the injected electrons. Thus, the current capacity of the composite semiconductor device 1 is made much larger.

(3) Since a pn diode D is formed by the p layer 22, $n^-$ layer 12 and $n^+$ layer 11 in the composite semiconductor device 1, reverse conduction can be made even when no gate potential is applied. The conventional composite semiconductor device did not have this feature.

Although the foregoing has been made as to the embodiment of the composite semiconductor device according to the present invention which is formed on the $n^+$ 11, it is a matter of course that the same effects can be obtained in the case where the device is formed on a substrate formed of a $p^+$ layer with the conductivity types of the respective layers being reversed.

Figure 5:
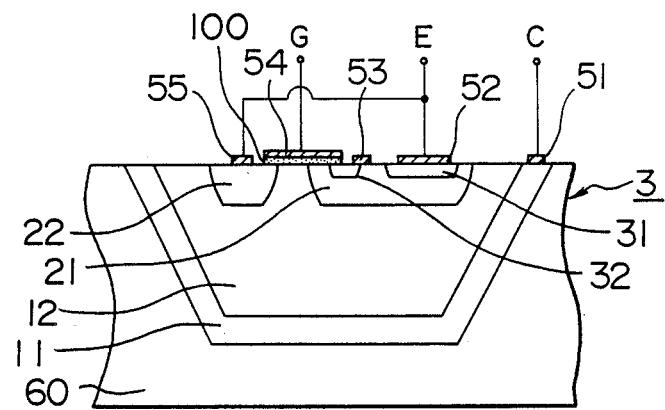
FIG. 5 is a cross section of another embodiment of the composite semiconductor device according to present invention.

FIG. 5 is a cross section showing another embodiment in which the present invention is applied to a planar type semiconductor device. Specifically, in this embodiment, the present invention is applied to a high dielectric strength integrated circuit.

In FIG. 5, parts the same as or equivalent to those in FIG. 3 are correspondingly referenced.

The $n^+$ layer 11, $n^-$ layer 12, p layer 21, p layer 22, n layer 31, and n layer 32 are formed in a high resistance polycrystal silicon 60, and this embodiment has features in that the n+layer 11 is formed so as to surround the n−layer 12 and the collector electrode 51 is provided on the same side as the other electrodes. It will be apparent, that the device of this embodiment can operate in the same manner as the device of FIG. 3 and has the same features as those of the device of FIG. 3.

Further, it is a matter of course that the present invention can be applied not only to a high dielectric strength IC but to a so-called bipolar CMOS.LSI in which a bipolar transistor and a C.MOSFET are integrated.

We claim:

1. A composite semiconductor device comprising:
    a first semiconductor region of a first conductivity type;
    second and third semiconductor regions of a second conductivity type formed in said first semiconductor region independently of each other so as to be exposed at one main surface of said semiconductor device;
    fourth and fifth semiconductor regions of the first conductivity type formed in said second semiconductor region independently of each other so as to be exposed at said one main surface,
    a first insulated gate electrode formed on a portion of said second semiconductor region with an insulating layer formed between said first insulated gate electrode and said second semiconductor region, said portion of said second semiconductor region being disposed at said one main surface between said fifth and first semiconductor regions so that said first and fifth semiconductor regions and said first insulated gate electrode will form a first insulated gate field effect transistor having a channel region comprised of said portion of said second semiconductor region disposed between the first and the fifth semiconductor regions;
    a second insulated gate electrode formed on a portion of said first semiconductor region with an insulating layer formed between said second insulated gate electrode and said portion of said first semiconductor region, said portion of said first semiconductor region being disposed at said one main surface between said second and third semiconductor regions so that said second and third semiconductor regions and said second insulated gate electrode will form a second insulated gate field effect transistor having a channel region comprised of said portion of said first semiconductor region disposed between said second and third semiconductor regions;
    first electrode means formed on said fourth semiconductor region and separated from said second semiconductor region;
    second electrode means formed to provide a short circuit between said second and fifth semiconductor regions;
    third electrode means connected to said first semiconductor region;
    fourth electrode means formed on said third semiconductor region; and
    means for electrically connecting said first electrode means to said fourth electrode means.

2. A composite semiconductor device according to claim 1, in which said first and second insulated gate electrodes are electrically connected with each other.

3. A composite semiconductor device according to claim 2, in which said first and second insulated gate electrodes are integrally formed so as to spread over said first and second semiconductor regions.

4. A composite semiconductor device according to claim 3, in which said first, second, and fourth semiconductor regions constitute a bipolar transistor.

5. A composite semiconductor device according to claim 4, in which said first and third semiconductor regions constitute a diode.

* * * * *